(12) United States Patent
Dhananjay et al.

(10) Patent No.: US 10,116,473 B1
(45) Date of Patent: Oct. 30, 2018

(54) CONTROLLING NOISE TRANSFER FUNCTION OF SIGNAL PATH TO REDUCE CHARGE PUMP NOISE

(71) Applicant: Cirrus Logic International Semiconductor Ltd., Edinburgh (GB)

(72) Inventors: Pradeep Dhananjay, Austin, TX (US); Tejasvi Das, Austin, TX (US); Bhupendra Manola, Austin, TX (US); Bruce E. Duewer, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/926,395

(22) Filed: Mar. 20, 2018

Related U.S. Application Data

(60) Provisional application No. 62/490,730, filed on Apr. 27, 2017, provisional application No. 62/490,922, filed on Apr. 27, 2017, provisional application No. 62/515,785, filed on Jun. 6, 2017.

(51) Int. Cl.
*H04L 25/49* (2006.01)
*H04L 25/03* (2006.01)
*H04R 3/04* (2006.01)
*H04B 14/04* (2006.01)

(52) U.S. Cl.
CPC ....... *H04L 25/4927* (2013.01); *H04B 14/046* (2013.01); *H04L 25/03159* (2013.01); *H04R 3/04* (2013.01)

(58) Field of Classification Search
CPC . H04L 25/4927; H04L 25/03159; H04R 3/04; H04B 14/046
See application file for complete search history.

(56) References Cited

U.S. PATENT DOCUMENTS

| | | | |
|---|---|---|---|
| 2003/0173937 A1* | 9/2003 | Uematsu | H02M 3/1584 323/205 |
| 2010/0239102 A1* | 9/2010 | Miao | H03F 1/26 381/73.1 |
| 2014/0117955 A1* | 5/2014 | Zoso | H02M 3/157 323/271 |
| 2015/0162885 A1* | 6/2015 | Lesso | H03F 1/0227 330/279 |

OTHER PUBLICATIONS

International Search Report and Written Opinion of the International Searching Authority, International Application No. PCT/US2018/029137, dated Jul. 27, 2018.

\* cited by examiner

*Primary Examiner* — Sonia L Gay
(74) *Attorney, Agent, or Firm* — Jackson Walker L.L.P.

(57) ABSTRACT

An apparatus may include a delta-sigma modulator for quantization noise shaping of a digital signal, a digital-to-analog converter configured to generate an analog signal from the digital signal, and an amplifier configured to amplify the analog signal and powered from a charge pump, wherein the charge pump is configured to operate at a switching frequency approximately equal to a zero of a modulator noise transfer function of the delta-sigma modulator, such that the impact of charge pump noise on a total harmonic distortion noise of the apparatus is minimized.

6 Claims, 3 Drawing Sheets

CONTROLLING NOISE TRANSFER FUNCTION OF SIGNAL PATH TO REDUCE CHARGE PUMP NOISE

CROSS-REFERENCES AND RELATED APPLICATION

The present disclosure claims benefit of U.S. Provisional Patent Application Ser. No. 62/490,730, filed Apr. 27, 2017, U.S. Provisional Patent Application Ser. No. 62/490,922, filed Apr. 27, 2017, and U.S. Provisional Patent Application Ser. No. 62/515,785, filed Jun. 6, 2017, all of which are incorporated by reference herein in their entirety.

FIELD OF DISCLOSURE

The present disclosure relates in general to charge pump power supplies, including without limitation personal audio devices such as wireless telephones and media players, and more specifically, to systems and methods for throttling output power generated by a charge pump in order to maintain an input current limit to the charge pump.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device, which may affect its marketability and desirability, is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of the power amplifier, such that any increased dynamic range as a result of a high-gain amplifier may be offset by signal noise which may effectively mask lower-intensity audio signals.

U.S. patent application Ser. No. 14/083,972, filed Nov. 19, 2013, entitled "Enhancement of Dynamic Range of Audio Signal Path," and assigned to the applicant (Cirrus Logic, Inc.) of the present disclosure (the "'972 application") discloses methods and systems for enhancing the dynamic range of an audio signal path. In the '972 application, an apparatus for providing an output signal to an audio transducer includes a digital signal path portion, an analog signal path portion, a digital-to-analog converter (DAC) interfaced between the digital signal path portion and the analog signal path portion, and a control circuit. The digital path portion may have a selectable digital gain and may be configured to generate a digital audio output signal in conformity with the selectable digital gain, and the DAC may be configured to generate an analog signal from the digital output signal. The analog signal path portion may have an audio input for receiving the analog signal, an audio output for providing the output signal, and a selectable analog gain, and may be configured to generate the output signal based on the analog signal and in conformity with the selectable analog gain. The control circuit may be configured to select the selectable analog gain and select the selectable digital gain based on a magnitude of a signal indicative of the output signal.

Effective operation of a dynamic range enhancement system often requires passband flatness of a signal path over a frequency range of interest, as deviations from a flat passband can lead to false triggering of the dynamic range enhancement system to alter the selectable analog gain and the selectable digital gain. However, each of an analog signal path portion and a digital path portion of a signal path may have transfer functions which are not flat over a frequency range of interest, a condition often referred to as "magnitude droop."

The power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a variable power supply voltage to such a power amplifier, a charge pump power supply may be used, for example such as that disclosed in U.S. Pat. No. 8,311,243, in which an indication of the signal level at the output of the circuit is used to control the power supply voltage in a Class-G topology. The above-described topology may raise the efficiency of the audio amplifier, in general, as long as periods of low signal level are present in the audio source. Typically in such topologies, a plurality of thresholds define output signal level-dependent operating modes for the charge pump power supply, wherein a different supply voltage is generated by the charge pump power supply in each mode.

SUMMARY

In accordance with the teachings of the present disclosure, certain disadvantages and problems associated with performance of charge pumps have been reduced or eliminated.

In accordance with embodiments of the present disclosure, an apparatus for generating an output signal may comprise a signal path having an analog signal path portion having an audio input for receiving an analog signal, an audio output for providing an output signal, and a selectable analog gain, and configured to generate the output signal based on the analog signal and in conformity with the selectable analog gain, wherein a transfer function of the analog signal path portion has an analog magnitude droop, a digital signal path portion having a selectable digital gain and configured to receive and process a digital input signal in conformity with the selectable digital gain, wherein a transfer function of the digital signal path portion has a digital magnitude droop, a digital-to-analog converter for converting the digital input signal, as processed by the digital path portion, into the analog signal, a first digital compensation filter that compensates for the analog magnitude droop, and a second digital compensation filter that compensates for the digital magnitude droop, such that the first digital compensation filter and the second digital compensation filter together compensate for magnitude droop of the signal path to ensure a substantially flat passband response of the signal path.

In accordance with these and other embodiments of the present disclosure, a method for generating an output signal by a signal path may include generating the output signal by an analog signal path portion of the signal path having an audio input for receiving an analog signal, an audio output for providing the output signal, and a selectable analog gain, and configured to generate the output signal based on the analog signal and in conformity with the selectable analog gain, wherein a transfer function of the analog signal path portion has an analog magnitude droop. The method may also include processing a digital input signal in conformity with a selectable digital gain by a digital signal path portion of the signal path having the selectable digital gain and configured to receive and process a digital input signal in conformity with the selectable digital gain, wherein a transfer function of the digital signal path portion has a digital magnitude droop. The method may additionally include converting the digital input signal, as processed by the digital path portion, by a digital-to-analog converter of the signal path into the analog signal. The method may further include compensating for the analog magnitude droop with a first digital compensation filter and compensating for the digital magnitude droop with a second digital compensation filter, such that the first digital compensation filter and the second digital compensation filter together compensate for magnitude droop of the signal path to ensure a substantially flat passband response of the signal path.

In accordance with these and other embodiments of the present disclosure, an apparatus may include a delta-sigma modulator for quantization noise shaping of a digital signal, a digital-to-analog converter configured to generate an analog signal from the digital signal, and an amplifier configured to amplify the analog signal and powered from a charge pump, wherein the charge pump is configured to operate at a switching frequency approximately equal to a zero of a modulator noise transfer function of the delta-sigma modulator, such that the impact of charge pump noise on a total harmonic distortion noise of the apparatus is minimized.

In accordance with these and other embodiments of the present disclosure, a method is provided for minimizing noise in an apparatus comprising a delta-sigma modulator for quantization noise shaping of a digital signal, a digital-to-analog converter configured to generate an analog signal from the digital signal, and an amplifier configured to amplify the analog signal and powered from a charge pump. The method may include operating the charge pump at a switching frequency approximately equal to a zero of a modulator noise transfer function of the delta-sigma modulator, such that the impact of charge pump noise on a total harmonic distortion noise of the apparatus is minimized.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
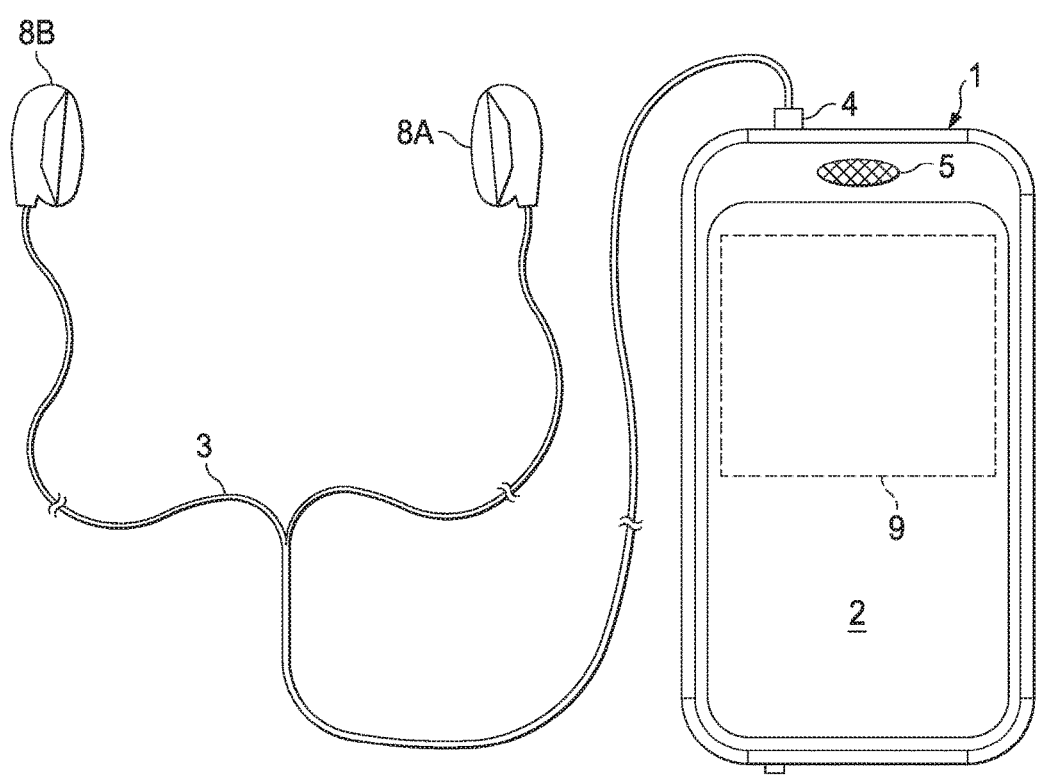
FIG. 1 is an illustration of an example personal audio device, in accordance with embodiments of the present disclosure.

FIG. 1 is an illustration of an example personal audio device 1, in accordance with embodiments of the present disclosure. Personal audio device 1 is an example of a device in which techniques in accordance with embodiments of the present disclosure may be employed, but it is understood that not all of the elements or configurations embodied in illustrated personal audio device 1, or in the circuits depicted in subsequent illustrations, are required in order to practice the subject matter recited in the claims. Personal audio device 1 may include a transducer such as speaker 5 that reproduces distant speech received by personal audio device 1, along with other local audio events such as ringtones, stored audio program material, injection of near-end speech (i.e., the speech of the user of personal audio device 1) to provide a balanced conversational perception, and other audio that requires reproduction by personal audio device 1, such as sources from webpages or other network communications received by personal audio device 1 and audio indications such as a low battery indication and other system event notifications. In addition or alternatively, a headset 3 may be coupled to personal audio device 1 for generating audio. As shown in FIG. 1, a headset 3 may be in the form of a pair of earbud speakers 8A and 8B. A plug 4 may provide for connection of headset 3 to an electrical terminal of personal audio device 1. Headset 3 and speaker 5 depicted in FIG. 1 are merely examples, and it is understood that personal audio device 1 may be used in connection with a variety of audio transducers, including without limitation, captive or integrated speakers, headphones, earbuds, in-ear earphones, and external speakers.

Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, speaker 5, and/or another audio transducer.

Figure 2:
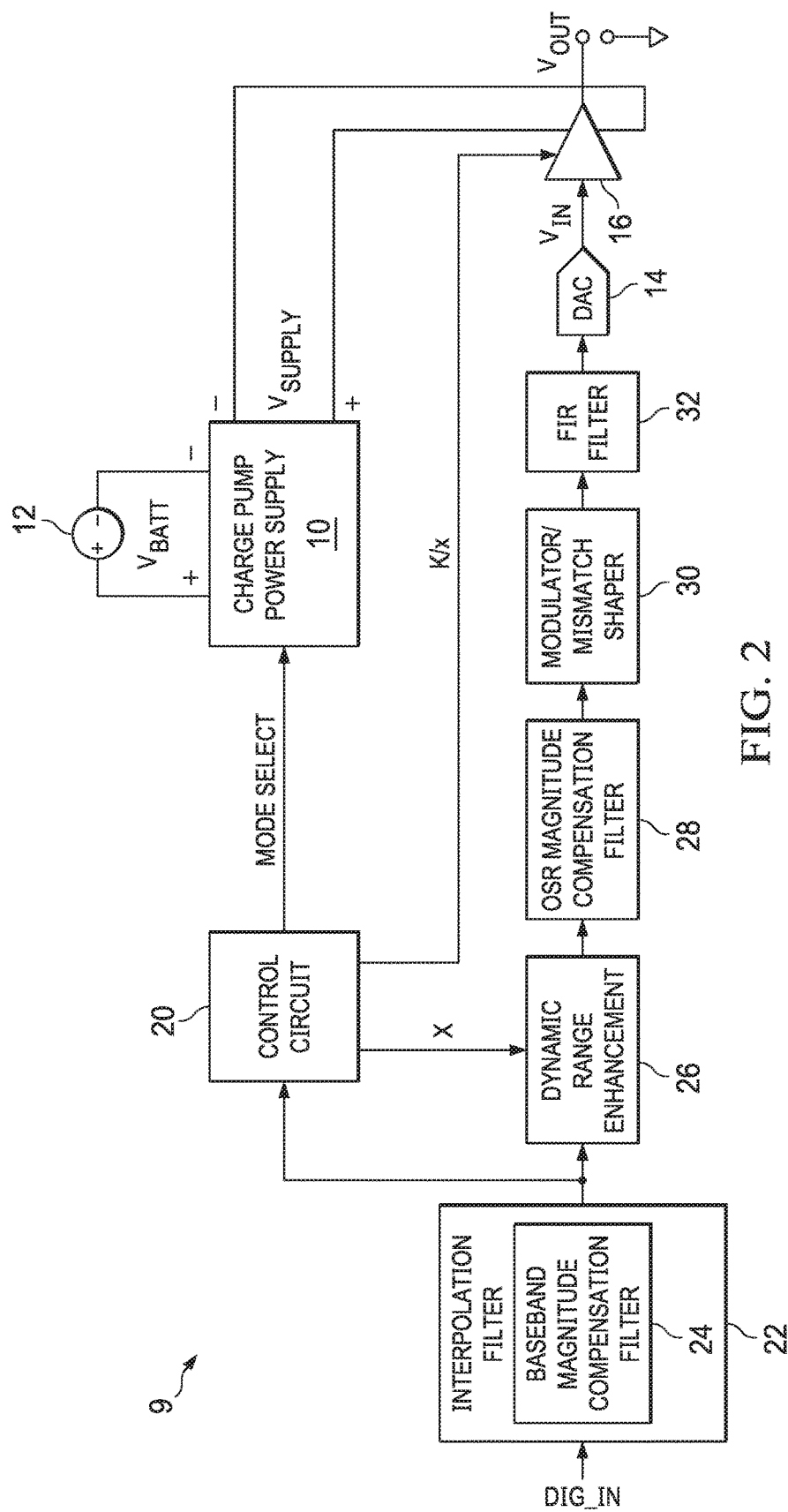
FIG. 2 is a block diagram of selected components of an example integrated circuit, which may be implemented as an audio integrated circuit of the personal audio device depicted in FIG. 1 or any other suitable device, in accordance with embodiments of the present disclosure.

FIG. 2 is a block diagram of selected components of an example IC 9, which may be implemented as audio IC 9 of personal audio device 1 or any other suitable device, in accordance with embodiments of the present disclosure. As shown in FIG. 2, a digital signal source (e.g., a processor, digital signal processor, microcontroller, test equipment, or other suitable digital signal source) may supply a digital input signal DIG_IN to a digital path portion of a signal path, the digital path portion comprising an interpolation filter 22, dynamic range enhancement block 26, oversampling rate (OSR) magnitude compensation filter 28, modulator/mismatch shaper 30, and finite impulse response (FIR) filter 32. The digital path portion may generate a digital output signal to digital-to-analog converter (DAC) 14, which may in turn convert the digital output signal DIG_IN into an equivalent analog input signal $V_{IN}$ and communicate analog input signal $V_{IN}$ to a power amplifier stage 16 which may amplify or attenuate the analog input signal $V_{IN}$ and provide an output signal $V_{OUT}$, which, in embodiments in which digital input signal DIG_IN, analog input signal $V_{IN}$, and output signal $V_{OUT}$ are audio signals, may operate a speaker, headphone transducer, and/or a line level signal output. However, application of IC 9 as depicted in FIG. 2 may not be limited to audio applications. In addition, although amplifier stage 16 is depicted as a single-ended output generating a single-ended audio output signal $V_{OUT}$, in some embodiments, amplifier stage 16 may comprise a differential output, and may thus provide a differential audio output signal $V_{OUT}$.

A charge pump power supply 10 may provide the power supply rail inputs of a supply voltage $V_{SUPPLY}$ to amplifier 16 and may receive a power source input, generally from a battery 12 or other power supply, which may provide an input voltage $V_{BATT}$ to charge pump power supply 10. A control circuit 20 may supply a mode select signal to charge pump power supply 10 that selects an operating mode of charge pump power supply 10 so as to adjust supply voltage $V_{SUPPLY}$ generated by charge pump power supply 10 according to expected and/or actual signal levels at the output of amplifier 16. When low signal levels exist and/or are expected at amplifier output $V_{OUT}$, mode control circuit 20 may improve the power efficiency of audio IC 9 by varying the supply voltage $V_{SUPPLY}$ in conformity with the output signal $V_{OUT}$ or a signal (e.g., digital input signal DIG_IN) indicative of the output signal $V_{OUT}$. Accordingly, to maintain power efficiency, at any given time control circuit 20 may select an operating mode from a plurality of operating modes in each operating mode operating charge pump power supply 10 at a different supply voltage, $V_{SUPPLY}$, wherein the supply voltage $V_{SUPPLY}$ in one operational mode is a rational multiple or ratio of supply voltages of other operational modes.

Interpolation filter 22 may comprise any suitable system for upsampling digital input signal DIG_IN to generate a resulting digital signal having a sampling rate larger than that of digital input signal DIG_IN.

The upsampled digital signal generated by interpolation filter 22 may in turn be processed by dynamic range enhancement block 26, which may implement a gain element for performing dynamic range enhancement. As shown in FIG. 2, control circuit 20 may be configured to (e.g., in addition to controlling a mode of charge pump power supply 10), based on digital audio input signal DIG_IN (or a signal derived therefrom), control selectable digital gain x of dynamic range enhancement block 26 and a selectable analog gain k/x of amplifier stage 16.

As an example of the dynamic range enhancement functionality of audio IC 9, when digital audio input signal DIG_IN is at or near zero decibels (0 dB) relative to the full-scale voltage of the digital audio input signal, gain control circuit 20 may select a first digital gain (e.g., $x_1$) for the selectable digital gain and a first analog gain (e.g., $k/x_1$) for the selectable analog gain. However, if the magnitude of digital audio input signal DIG_IN is below a particular predetermined threshold magnitude relative to the full-scale voltage of digital audio input signal DIG_IN (e.g., −20 dB), gain control circuit 20 may select a second digital gain (e.g., $x_2$) greater than the first digital gain (e.g., $x_2 > x_1$) for the selectable digital gain and a second analog gain (e.g., $k/x_2$) lesser than the first analog gain (e.g., $k/x_2 < k/x_1$) for the selectable analog gain. In each case, the cumulative path gain (e.g., k) of the selectable digital gain and the selectable analog gain may be substantially constant (e.g., the same within manufacturing and/or operating tolerances of audio IC 9). In some embodiments, k may be approximately equal to 1, such that the cumulative path gain is a unity gain. Such modification of digital gain and analog gain may increase the dynamic range of audio IC 9 compared to approaches in which the digital gain and analog gain are static, as it may reduce the noise injected into audio output signal $V_{OUT}$, which noise may be a generally monotonically increasing function of the analog gain of amplifier stage 16. While such noise may be negligible for higher magnitude audio signals (e.g., at or near 0 dB relative to full-scale voltage), the presence of such noise may become noticeable for lower magnitude audio signals (e.g., at or near −20 dB or lower relative to full-scale voltage). By applying a smaller analog gain at amplifier stage 16 for smaller signal magnitudes, the amount of noise injected into audio output signal $V_{OUT}$ may be reduced, while the signal level of audio output signal $V_{OUT}$ may be maintained in accordance with the digital audio input signal DIG_IN through application of a digital gain to dynamic range enhancement block 26 inversely proportional to the analog gain.

The output of dynamic range enhancement block 26 may be received and processed by OSR magnitude compensation filter 28. As described in much greater detail below, OSR magnitude compensation filter 28 may compensate for magnitude droop in the frequency response of elements of the digital path portion other than OSR magnitude compensation filter 28.

The output generated by OSR magnitude compensation filter 28 may in turn be processed by modulator/mismatch shaper 30. Modulator/mismatch shaper 30 may comprise any system for shaping quantization noise present in the digital signal it receives. In some embodiments, modulator/mismatch shaper 30 may comprise a delta-sigma modulator for quantization noise shaping of such a digital signal.

The output generated by modulator/mismatch shaper 30 may be further processed by FIR filter 32. FIR filter 32 may comprise any suitable filter having an impulse response that is of finite duration. In audio IC 9, FIR filter 32 may serve one or more functions. First, FIR filter 32 may provide a zero approximately equal to the switching frequency of charge pump power supply 10, as described elsewhere in this disclosure, to reduce charge pump noise. In addition or alternatively, FIR filter 32 may reduce out-o-band noise introduced by modulator/mismatch shaper 30, which may lead to a reduction in a slew rate that an amplifier must support in order to track audio output signal $V_{OUT}$.

The digital signal generated by FIR filter 32, being the digital output signal generated by the digital path portion, may be, as described above, converted into an equivalent analog signal (e.g., $V_{IN}$) by DAC 14, which in turn may be amplified by amplifier stage 16.

As described in the Background section of this application, the signal path of audio IC 9 may suffer from magnitude droop, in which a passband frequency response which is not flat across a frequency range of interest, and such magnitude droop can lead to false triggering of the dynamic range enhancement system. In many instances, different portions of the signal path may contribute separately to magnitude droop. For example, the digital path portion (in the absence of OSR magnitude compensation filter 28) may have a digital magnitude droop, and DAC 14 and amplifier stage 16 may together have an analog magnitude droop.

To compensate for digital magnitude droop, and in particular, droop induced by interpolation filter 22, interpolation filter 22 may include a baseband magnitude compensation filter 24 that compensates for the digital magnitude droop. Accordingly, control circuit 20 may determine which gain to apply for the selectable digital gain of dynamic range enhancement block 26 and which gain to apply for the selectable analog gain of amplifier stage 16 based on an analysis of a droop-corrected digital signal.

Further, OSR magnitude compensation filter 28 may have a transfer function to compensate for analog magnitude droop and droop incurred in the signal path after dynamic range enhancement block 26. Thus, together baseband magnitude compensation filter 24 and OSR magnitude compensation filter 28 may compensate for magnitude droop of the entire signal path to ensure a substantially flat passband response of the entire signal path. Moreover, in some embodiments, baseband magnitude compensation filter 24 and OSR magnitude compensation filter 28 may improve noise performance of the signal path for higher frequency signals, as much of the lack of passband flatness of the uncompensated signal path may exist at higher frequencies. In addition, in these and other embodiments, oversampling rate magnitude filter 28 may be configured to improve a stopband attenuation for the signal path.

In some embodiments, filter coefficients for baseband magnitude compensation filter 24 and OSR magnitude compensation filter 28 may be optimized for different gain configurations of the selectable analog gain and the selectable digital gain. For example, for a first dynamic range enhancement mode in which selectable analog gain is of a first analog gain value and the selectable digital gain is of a first digital gain value, filter coefficients for baseband magnitude compensation filter 24 and OSR magnitude compensation filter 28 may have values which are different than the values such filter coefficients may have for a second dynamic range enhancement mode in which selectable analog gain is of a second analog gain value and the selectable digital gain is of a second digital gain value. In these embodiments, such filter coefficients may be stored in a memory and may be retrieved by any suitable component (e.g., control circuit 20) for applying the filter coefficients in response to changes in dynamic range enhancement gain modes.

Figure 3:
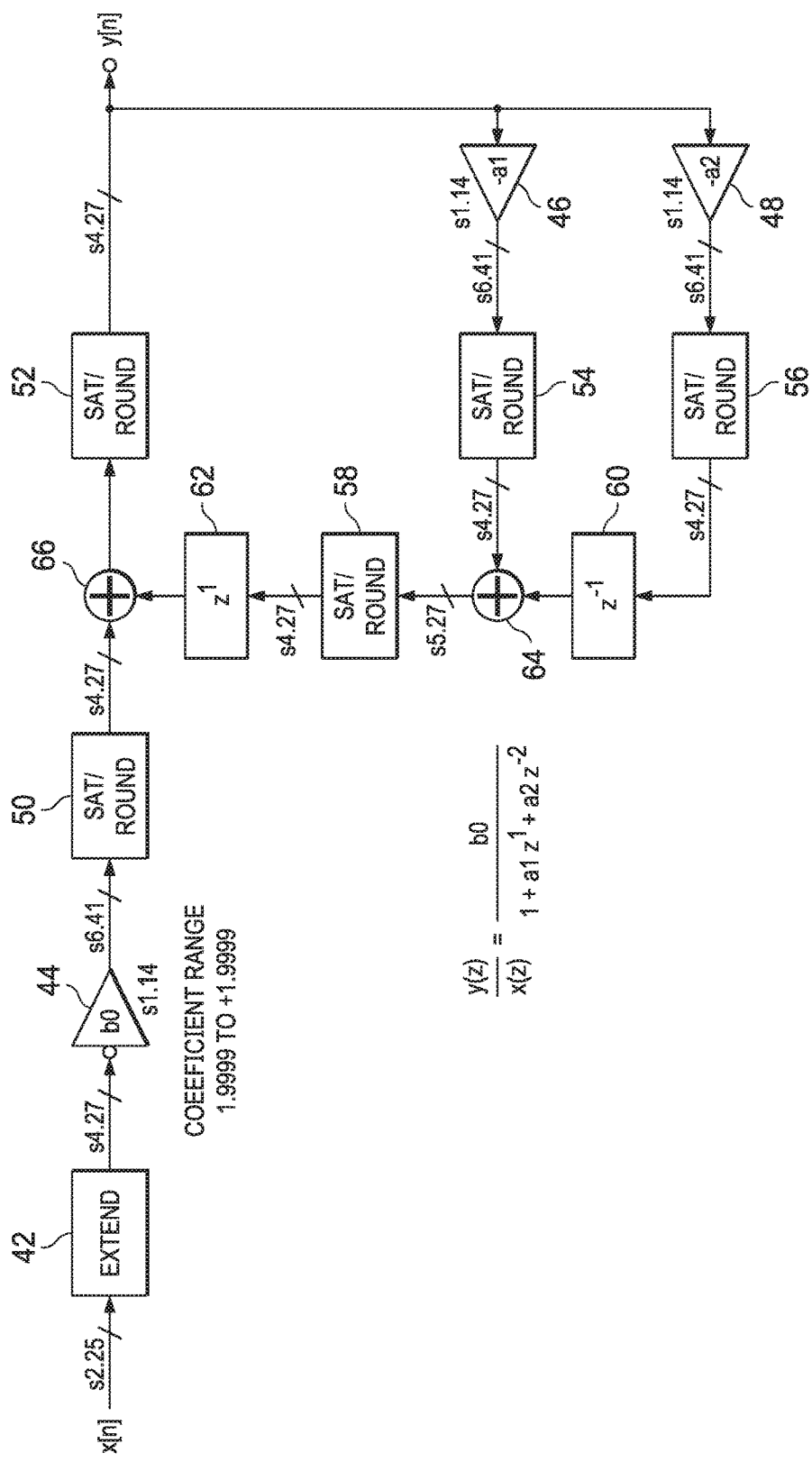
FIG. 3 is a block diagram of selected components of an example oversampling rate magnitude compensation filter, in accordance with embodiments of the present disclosure.

FIG. 3 is a block diagram of selected components of an example OSR magnitude compensation filter 28, in accordance with embodiments of the present disclosure. In some embodiments, example OSR magnitude compensation filter 28 may include an extend block 42, gain element 44 with gain b0, gain element 46 with gain −a1, gain element 48 with gain −a2, saturation/rounding blocks 50, 52, 54, 56, and 58, delay blocks 60 and 62, and combiners 64 and 66, arranged as shown in FIG. 3. Example bit widths of various signals and gains are shown in FIG. 3 with the notation sx.yy, where "s" indicates a sign bit, "x" indicates a number of bits to the left of a decimal point, and "yy" indicates a number of bits to the right of the decimal point. One of skill in the art may recognize that the OSR magnitude compensation filter in FIG. 3 may have a transfer function in the z domain equal to $b0/(1+a1z^{-1}+a2z^{-2})$. Accordingly, a response of example OSR magnitude compensation filter 28 may be controlled and/or tuned by varying the filter coefficients/gains b0, a1, and a2 to achieve a response that effectively compensates for analog droop.

One potential disadvantage to having OSR magnitude compensation filter 28 present in the signal path of audio IC 9 is that because OSR magnitude compensation filter 28 which performs digital oversampling is followed by noise-shaping modulator/mismatch shaper 30, quantization noise present in the signal path may be shaped such that its contribution in the audio band is reduced, but quantization noise power may reside in higher frequencies close to the switching frequency of charge pump power supply 10. Total harmonic distortion noise for the signal path may be sensitive to noise on supply voltage $V_{SUPPLY}$, which may be dependent upon the switching frequency of charge pump power supply 10. Such supply-induced noise may be mixed with out-of-band quantization noise and folded into the audio band.

In order to reduce or eliminate such charge pump foldback noise, a delta-sigma modulator implementing at least a portion of modulator/mismatch shaper 30 may be configured to have a modulator noise transfer function with a zero at approximately the switching frequency of charge pump power supply 10, such that the impact of charge pump noise on a total harmonic distortion noise of the signal path is minimized. In these or other embodiments, FIR filter 32 interfaced between the delta-sigma modulator (e.g., modulator/mismatch shaper 30) and DAC 14 may have an FIR noise transfer function with a zero approximately equal to the switching frequency, such that the impact of charge pump noise on a total harmonic distortion noise of the signal path is minimized.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An apparatus comprising:
    a delta-sigma modulator for quantization noise shaping of a digital signal;
    a digital-to-analog converter configured to generate an analog signal from the digital signal; and
    an amplifier configured to amplify the analog signal and powered from a charge pump, wherein the charge pump is configured to operate at a switching frequency approximately equal to that of a zero of a modulator noise transfer function of the delta-sigma modulator, such that the impact of charge pump noise on a total harmonic distortion noise of the apparatus is minimized.

2. The apparatus of claim 1, further comprising a finite impulse response filter interfaced between the delta-sigma modulator and the digital-to-analog converter and having a finite impulse response noise transfer function with a zero approximately equal to the switching frequency.

3. The apparatus of claim 1, wherein the analog signal is an analog audio signal and the digital signal is a digital audio signal.

4. A method for minimizing noise in an apparatus comprising a delta-sigma modulator for quantization noise shaping of a digital signal, a digital-to-analog converter configured to generate an analog signal from the digital signal, and an amplifier configured to amplify the analog signal and powered from a charge pump, the method comprising:

operating the charge pump at a switching frequency approximately equal to that of a zero of a modulator noise transfer function of the delta-sigma modulator, such that the impact of charge pump noise on a total harmonic distortion noise of the apparatus is minimized.

5. The method of claim 4, further comprising operating a finite impulse response filter interfaced between the delta-sigma modulator and the digital-to-analog converter with a finite impulse response noise transfer function with a zero approximately equal to the switching frequency.

6. The method of claim 4, wherein the analog signal is an analog audio signal and the digital signal is a digital audio signal.

* * * * *